(12) United States Patent
Tran et al.

(10) Patent No.: US 6,259,644 B1
(45) Date of Patent: Jul. 10, 2001

(54) EQUIPOTENTIAL SENSE METHODS FOR RESISTIVE CROSS POINT MEMORY CELL ARRAYS

(75) Inventors: Lung T Tran, Saratoga; Frederick A Perner; James A Brug, both of Palo Alto, all of CA (US)

(73) Assignee: Hewlett-Packard Co, Palo Alto, CA (US)

(*) Notice: Subject to any disclaimer, the term of this patent is extended or adjusted under 35 U.S.C. 154(b) by 0 days.

(21) Appl. No.: 09/564,308

(22) Filed: May 3, 2000

Related U.S. Application Data

(63) Continuation-in-part of application No. 09/430,238, filed on Oct. 29, 1999, and a continuation-in-part of application No. 08/974,925, filed on Nov. 20, 1997, now Pat. No. 6,169,686.

(51) Int. Cl.[7] .................................................... G11C 7/02
(52) U.S. Cl. .......................... 365/209; 365/158; 365/171; 365/173
(58) Field of Search .................................. 365/158, 171, 365/173, 209

(56) References Cited

U.S. PATENT DOCUMENTS

| | | | |
|---|---|---|---|
| 5,654,566 | * 8/1997 | Johnson | 257/295 |
| 5,991,193 | 11/1999 | Gallagher et al. | 365/171 |
| 6,034,887 | * 3/2000 | Gupta et al. | 365/171 |
| 6,097,626 | * 8/2000 | Brug et al. | 365/171 |
| 6,111,783 | * 8/2000 | Tran et al. | 365/171 |
| 6,128,239 | * 10/2000 | Perner | 365/209 |

FOREIGN PATENT DOCUMENTS

19744095A1   10/1997   (DE) .

* cited by examiner

*Primary Examiner*—David Nelms
*Assistant Examiner*—Gene N. Auduong

(57) ABSTRACT

An equal potential may be applied to a selected bit line and unselected bit lines during a read operation on a memory cell in a resistive cross point array. In the alternative, an equal potential may be applied to the selected bit line and unselected word lines.

30 Claims, 9 Drawing Sheets

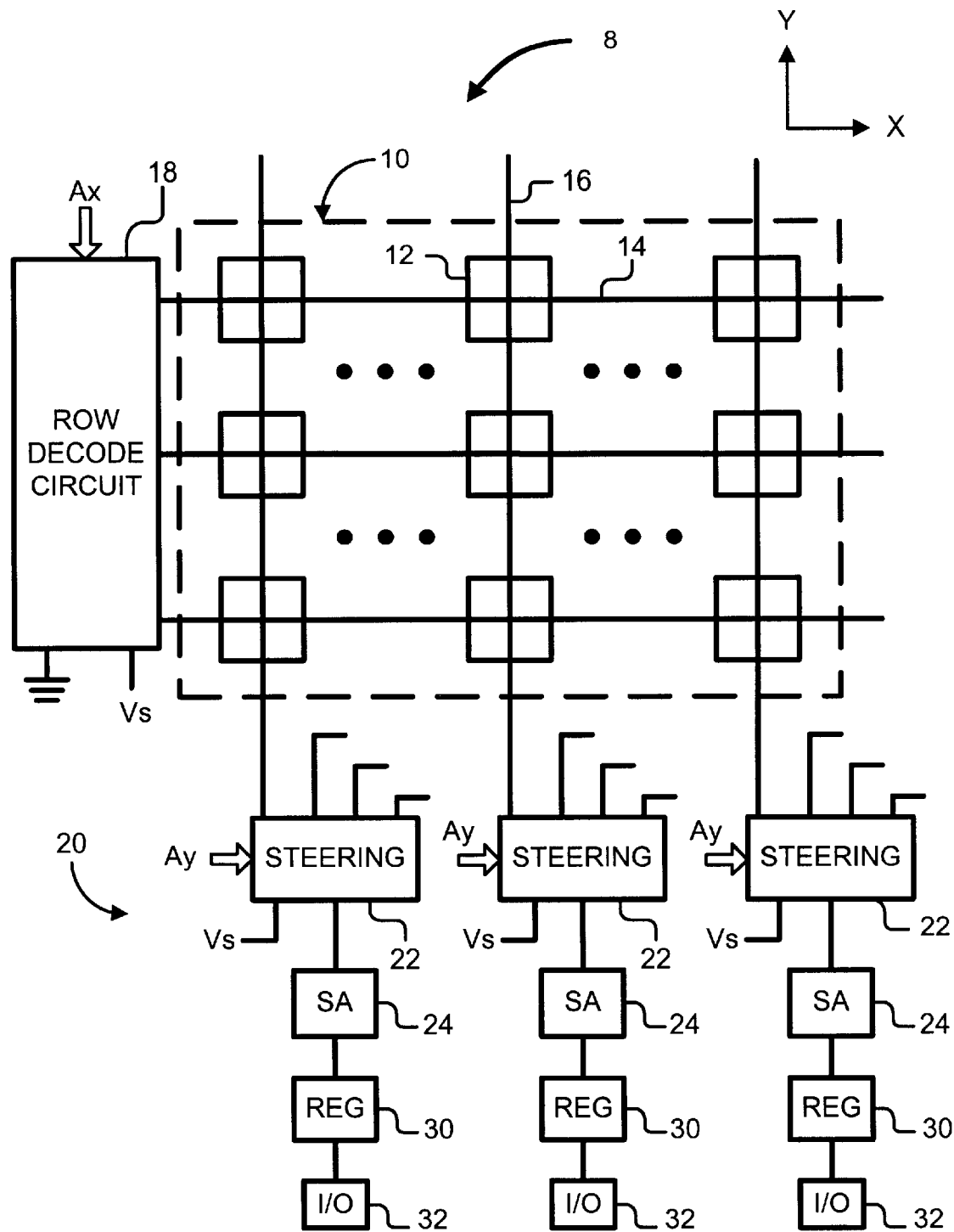

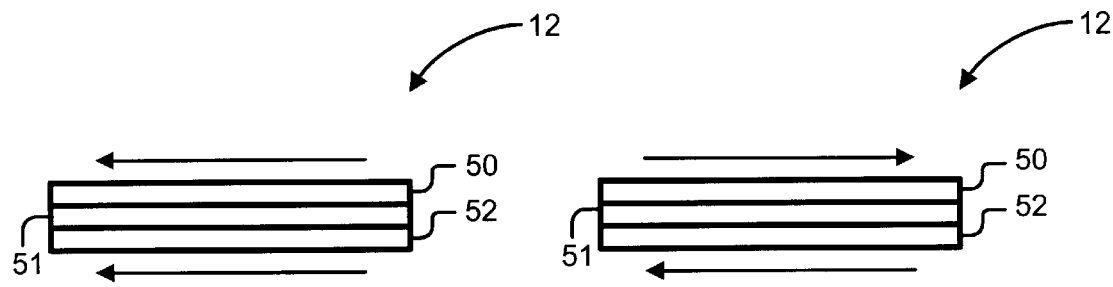
FIG. 2a  FIG. 2b
FIG. 3a
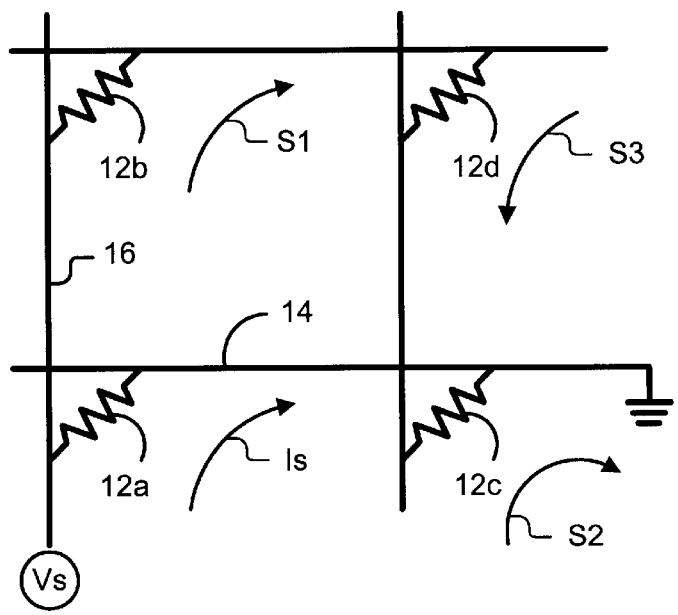

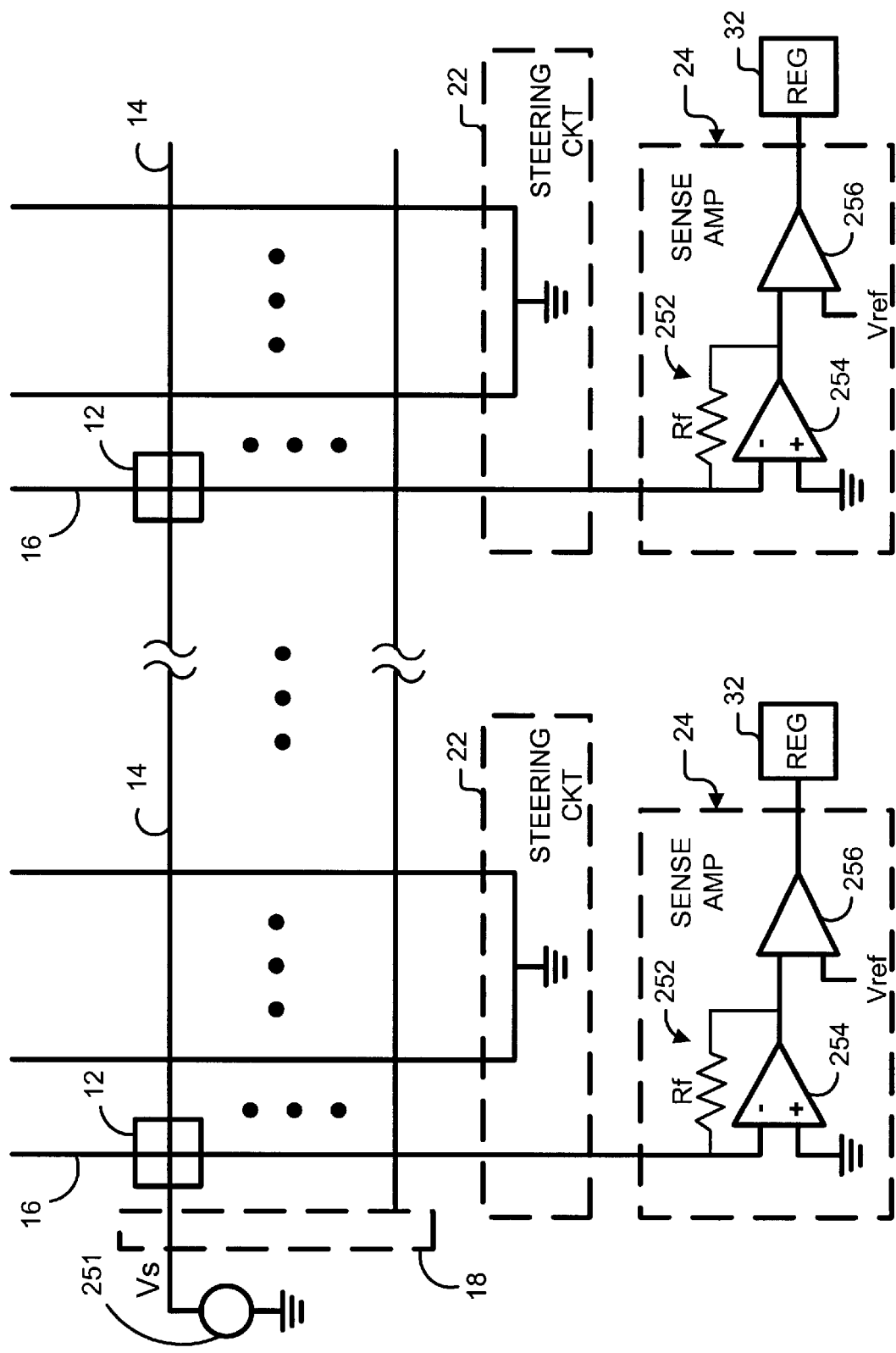

US 6,259,644 B1

EQUIPOTENTIAL SENSE METHODS FOR RESISTIVE CROSS POINT MEMORY CELL ARRAYS

CROSS-REFERENCE TO RELATED APPLICATIONS

This is a continuation-in-part of the following U.S. patent applications: Ser. No. 08/974,925 filed Nov. 20, 1997 and issued Jan. 2, 2001 as U.S. Pat. No. 6,169,686; and Ser. No. 09/430,238 filed Oct. 29, 1999, now pending.

BACKGROUND OF THE INVENTION

The present invention relates to data storage devices. More specifically, the present invention relates to a data storage device including a resistive cross point memory cell array and circuitry for sensing resistance states of memory cells in the array.

Magnetic Random Access Memory ("MRAM") is a non-volatile memory that is being considered for long term data storage. Performing read and write operations in MRAM devices would be orders of magnitude faster than performing read and write operations in conventional long term storage devices such as hard drives. In addition, the MRAM devices would be more compact and would consume less power than hard drives and other conventional long term storage devices.

A typical MRAM device includes an array of memory cells. Word lines extend along rows of the memory cells, and bit lines extend along columns of the memory cells. Each memory cell is located at a cross point of a word line and a bit line.

The memory cell stores a bit of information as an orientation of a magnetization. The magnetization of each memory cell assumes one of two stable orientations at any given time. These two stable orientations, parallel and anti-parallel, represent logic values of '0' and '1.'

The magnetization orientation affects the resistance of a memory cell such as a spin dependent tunneling junction device. For instance, resistance of a memory cell is a first value R if the magnetization orientation is parallel, and the resistance of the memory cell is increased to a second value R+ΔAR if the magnetization orientation is changed from parallel to anti-parallel. The magnetization orientation of a selected memory cell and, therefore, the logic state of the memory cell may be read by sensing the resistance state of the selected memory cell.

Sensing the resistance state of a single memory cell in the array can be unreliable. All memory cells in the array are coupled together through many parallel paths. The resistance seen at one cross point equals the resistance of the memory cell at that cross point in parallel with resistances of memory cells in the other rows and columns (the array of memory cells may be characterized as a cross point resistor network).

Moreover, if the memory cell being sensed has a different resistance state due to the stored magnetization, a small differential voltage may develop. This small differential voltage can give rise to parasitic or "sneak path" currents. The parasitic currents can interfere with the sensing of the resistance states.

There is a need to reliably sense the resistance states of memory cells in MRAM devices.

SUMMARY OF THE INVENTION

This need is met by the present invention. According to one aspect of the present invention, a read operation on a selected memory cell in a resistive cross point memory cell array is performed by applying a first potential to a bit line crossing the selected memory cell and a second potential to a word line crossing the selected memory cell; applying a third potential to a subset of unselected word and bit lines; and determining the resistance state of the selected memory cell while the potentials are being applied to the selected lines and subset of unselected lines. The third potential is equal to the first potential.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 1 is an illustration of an MRAM device according to the present invention;

FIGS. 2a and 2b are illustrations of parallel and anti-parallel magnetization orientations of an MRAM memory cell;

FIGS. 3a, 3b and 3c are illustrations of currents flowing through an electrical equivalent of an MRAM memory cell array;

FIG. 7 is an illustration of a hardware implementation of the second method;

DETAILED DESCRIPTION OF THE INVENTION

Figure 3B:
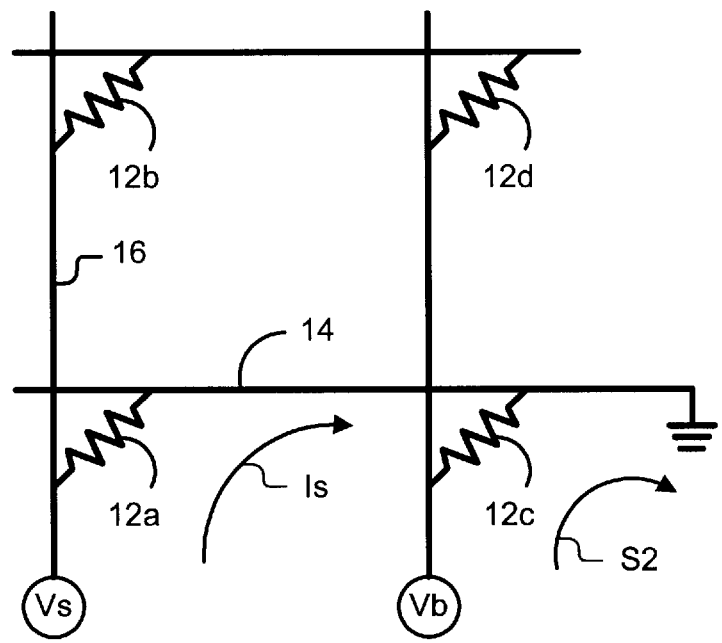

As shown in the drawings for purposes of illustration, the present invention is embodied in an MRAM device. The MRAM device includes an array of memory cells and circuitry for reliably sensing resistance states of the memory cells. During read operations, the circuitry applies an equal potential to selected and certain unselected word and bit lines. Applying the equal potential can prevent parasitic currents from interfering with the read operations.

Reference is now made to FIG. 1, which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the invention. In practice, arrays of any size may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the array 10. Each memory cell 12 is located at a cross point of a corresponding word line 14 and bit line 16.

The memory cells 12 are not limited to any particular type of device. For example the memory cells 12 may be spin dependent tunneling ("SDT") junction devices.

Referring now to FIGS. 2a and 2b, a typical SDT junction device 12 includes a pinned layer 52 having a magnetization that is oriented in the plane of the pinned layer 52 but fixed so as not to rotate in the presence of an applied magnetic field in a range of interest. The SDT junction device 12 also includes a "free" layer 50 having a magnetization orientation that is not pinned. Rather, the magnetization can be oriented in either of two directions along an axis (the "easy" axis) lying in the plane of the free layer 50. If the magnetization of the free and pinned layers 50 and 52 are in the same direction, the orientation is said to be "parallel" (as indicated by the arrows in FIG. 2a). If the magnetization of the free and pinned 50 and 52 layers are in opposite directions, the orientation is said to be "anti-parallel" (as indicated by the arrows in FIG. 2b). The magnetization in the free layer 50 may be oriented by applying write currents to word and bit lines 14 and 16 that cross the memory cell 12.

The free and pinned layers 50 and 52 are separated by an insulating tunnel barrier 51. The insulating tunnel barrier 51 allows quantum mechanical tunneling to occur between the free and pinned layers 50 and 52. This tunneling phenomenon is electron spin dependent, making the resistance of the SDT junction device 12 a function of the relative orientations of the magnetization of the free and pinned layers 50 and 52. For instance, resistance of the SDT junction device 12 is a first value R if the orientation of magnetization of the free and pinned layers 50 and 52 is parallel and a second value R+ΔR if the magnetization of orientation is anti-parallel.

Returning to FIG. 1, the MRAM device 8 also includes a row decode circuit 18. During read operations, the row decode circuit 18 may apply either a constant supply voltage Vs or a ground potential to the word lines 14. The constant supply voltage Vs may be provided by an external circuit.

The MRAM device 8 further includes a read circuit for sensing the resistance of selected memory cells 12 during read operations and a write circuit for orienting the magnetization of selected memory cells 12 during write operations. The read circuit is indicated generally at 20. The write circuit is not shown in order to simplify the explanation of the present invention.

The read circuit 20 includes a plurality of steering circuits 22 and sense amplifiers 24. Multiple bit lines 16 are connected to each steering circuit 22. Each steering circuit 22 includes a set of switches that connect each bit line 16 to either a source of operating potential or to a sense amplifier 24. An output of the sense amplifier 24 is supplied to a data register 30, which, in turn, is coupled to an I/O pad 32 of the MRAM device 8. If a single sense amplifier 24 can fit a pitch of four columns, 256 sense amplifiers 24 may be used for a 1024×1024 array 10 of memory cells 12. A total of k=4 bit lines 16 may be multiplexed into each sense amplifier 24. If the MRAM device 8 has multiple levels of memory cell arrays (see, for example, FIG. 11), bit lines 16 from the additional levels may be multiplexed into the sense amplifiers 24.

FIG. 3a shows an electrical equivalent of the memory cell array 10. A selected memory cell is represented by a first resistor 12a, and unselected memory cells are represented by second, third and fourth resistors 12b, 12c and 12d. The second resistor 12b represents the unselected memory cells along the selected bit line, the third resistor 12c represents the unselected memory cells along the selected word line, and the fourth resistor 12d represents the remaining unselected memory cells. If, for example, all of the memory cells 12 have a nominal resistance of about R and if the array 10 has n rows and m columns, then the second resistor 12b will have a resistance of about R/(n−1), the third resistor 12c will have a resistance of about R/(m−1), and the fourth resistor 12d will have a resistance of about R/[(n−1)(m−1)].

The first resistor 12a may be selected by applying an operating potential Vs to the crossing bit line and a ground potential to the crossing word line. Consequently, a sense current $I_S$ flows through the first resistor 12a. However, the second, third and fourth resistors 12b, 12c and 12d are also coupled between the operating potential Vs and the ground potential; therefore, sneak path currents S1, S2 and S3 can flow through the second, third and fourth resistors 12b, 12c and 12d. Moreover, the resistances of the second, third and fourth resistors 12b, 12c and 12d are much smaller than the resistance of the selected (first) resistor 12a; therefore, the sneak path currents S1, S2 and S3 are larger than the sense current $I_S$. Such sneak path currents S1, S2 and S3 would normally obscure the sense current $I_S$ during a read operation on the selected memory cell.

However, such obscuration can be reduced or eliminated by applying the same operating potential Vb=Vs to the unselected bit line, as shown in FIG. 3b. If Vb=Vs, the sneak path currents S1 and S3 will be blocked from flowing path through the second and fourth resistors 12b and 12d. The sneak path current S2 flowing through the second resistor 12c will be directed to the ground potential and, therefore, will not interfere with the sense current $I_S$.

Figure 3C:
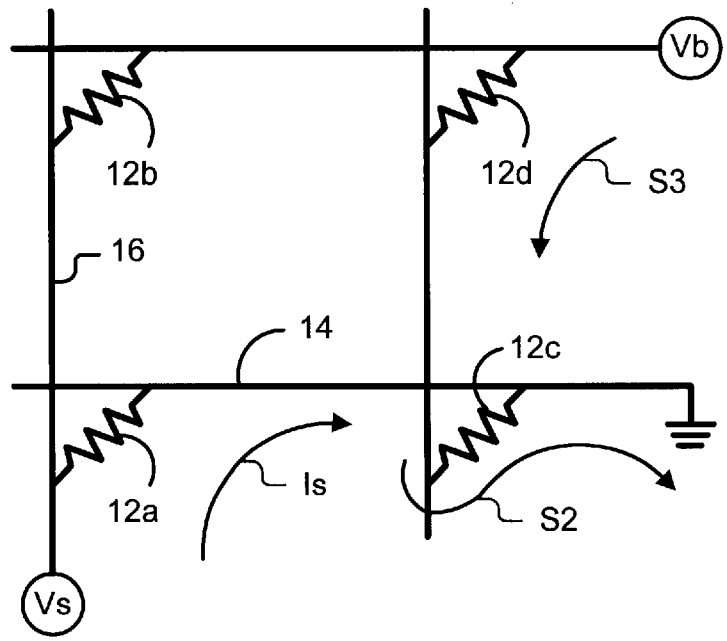

In the alternative, such obscuration can be reduced or eliminated by applying the same operating potential Vb=Vs to the unselected word line, as shown in FIG. 3c. The sneak path currents S1 will be blocked from flowing through the second resistor 12b. The sneak path currents S2 and S3 flowing through the third and fourth resistors 12c and 12d will be directed to the ground potential and, therefore, will not interfere with the sense current $I_s$.

Thus, applying an equal potential to the unselected bit or word lines of the array 10 would eliminate or reduce the obscuration of the sense current $I_S$. Consequently, the sense current $I_S$ and, therefore, the resistance state of the selected memory cell could be determined reliably.

Various methods of applying the equal potential to the memory cell array 10 and sensing the resistance state of the selected memory cell are described in the paragraphs that follow. A first method is described in connection with FIG. 4, a second method is described in connection with FIG. 6, and a third method is described in connection with FIG. 8. Hardware implementations of the various methods are also described below.

Figure 4:
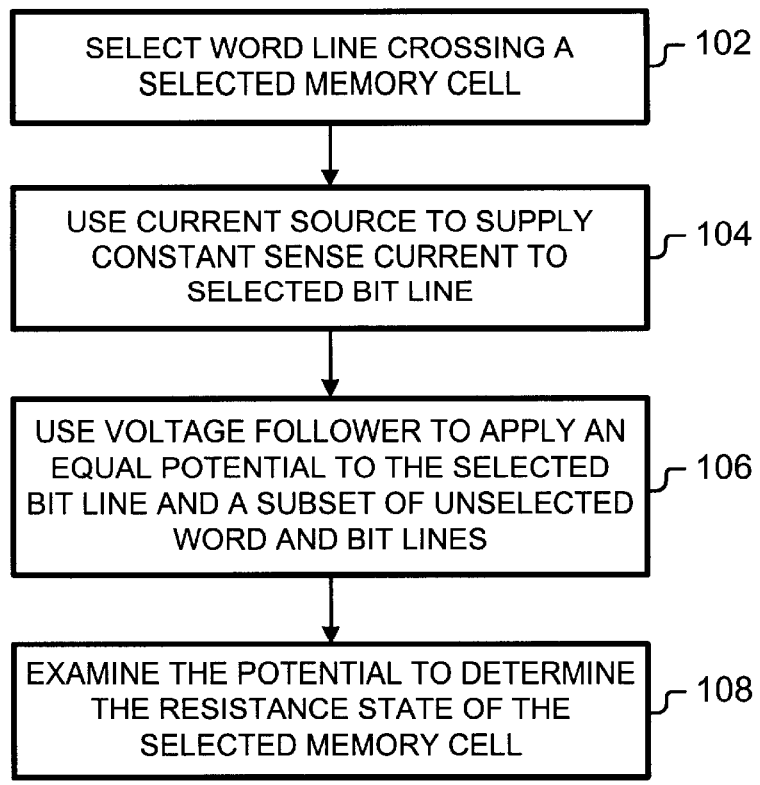
FIG. 4 is an illustration of a first method of reading a memory cell in an MRAM memory cell array.

Reference is now made to FIG. 4, which illustrates a method of using a current source, voltage follower and comparator to determine the resistance state of a selected memory cell. The row decode circuit selects a word line crossing the selected memory cell (block 102) by connecting the selected word line to the ground potential. The current source supplies a sense current to a bit line crossing the selected memory cell (block 104). A potential at a junction between the current source and the selected memory cell is detected by the voltage follower, which applies the same potential to a subset of unselected lines such as the unselected bit lines or the unselected word lines (106). The potential at the junction is also compared to a reference voltage by the comparator. An output of the comparator provides a high or low signal that indicates the resistance state of the selected memory cell (block 108).

Figure 5:
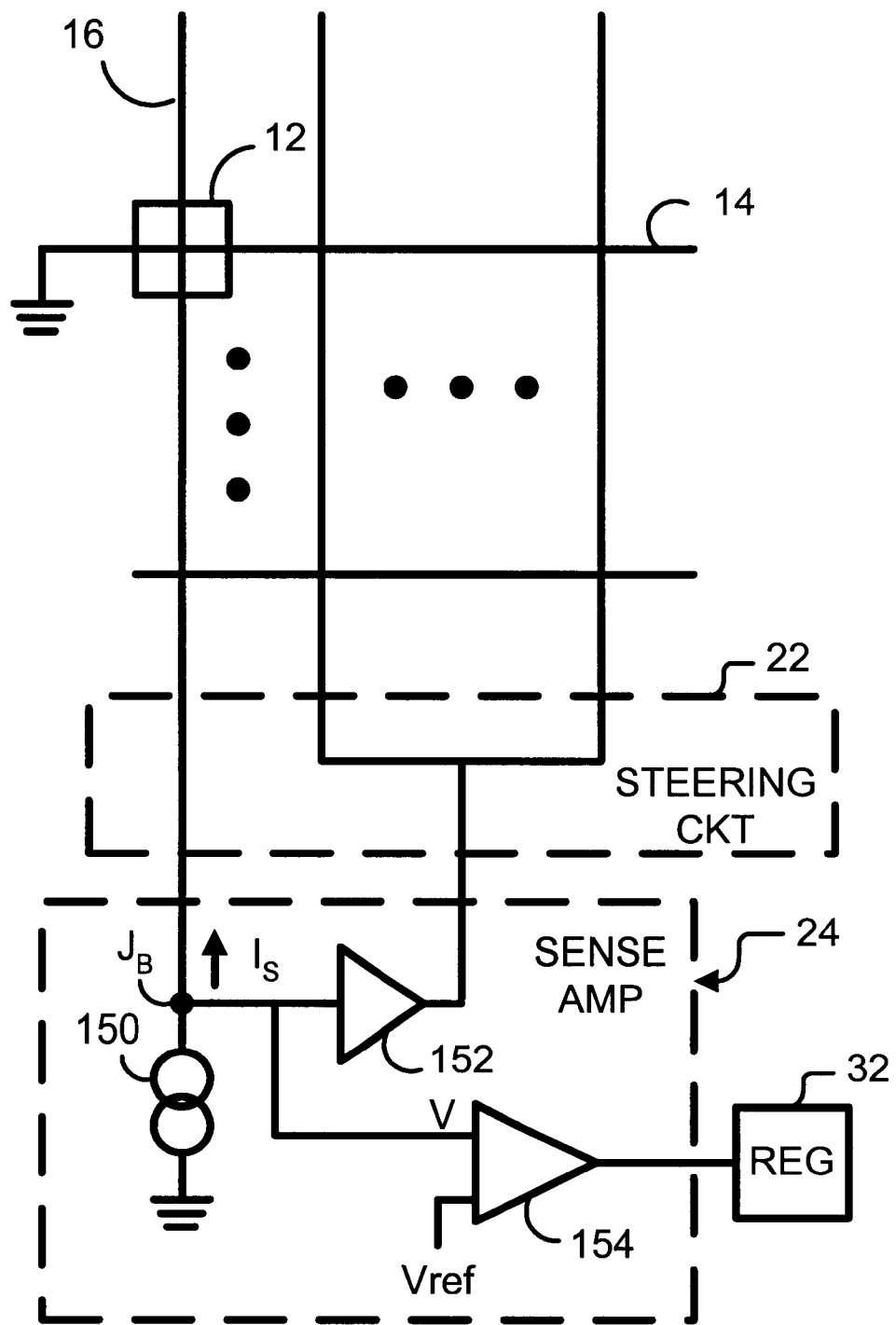
FIG. 5 is an illustration of a hardware implementation of the first method.

FIG. 5 shows a hardware implementation of the method described in connection with FIG. 4. The sense amplifier 24 includes the current source 150, the voltage follower 152 and the comparator 154. The current source may include a charge pump 150. During a read operation, the steering circuit 22 connects the charge pump 150 to the selected bit line 16, and the steering circuit 22 connects an output of the voltage follower 152 to the unselected bit lines.

The charge pump 150 supplies a constant sense current $I_S$, to the selected bit line during a read operation. When the sense current $I_S$ supplied to the selected memory cell 12, a voltage V develops across the selected memory cell. The voltage V is either $V=I_S R$ or $V=I_S(R+\Delta R)$. The comparator 154 compares this voltage V to a reference voltage Vref. An output of the comparator 154 provides a data signal to the register 32. If the reference voltage Vref is selected to be mid-way between $I_S R$ and $I_S(R+\Delta R)$, a voltage V that is less than the reference voltage Vref will indicate a resistance of R (a logic '0') and a voltage that is greater than the reference voltage Vref will indicate a resistance of $R+\Delta R$ (a logic '1'). The reference voltage Vref may be generated as described below.

While the sense current $I_S$ is flowing through the selected memory cell 12, the voltage follower 152 senses the potential at the junction $J_B$ between the charge pump 150 and selected memory cell 12 and applies an equal potential to the unselected bit lines. Consequently, sneak path currents do not interfere with the read operation. The voltage follower 152 may apply the same potential to the unselected word lines instead of the unselected bit lines.

Figure 6:
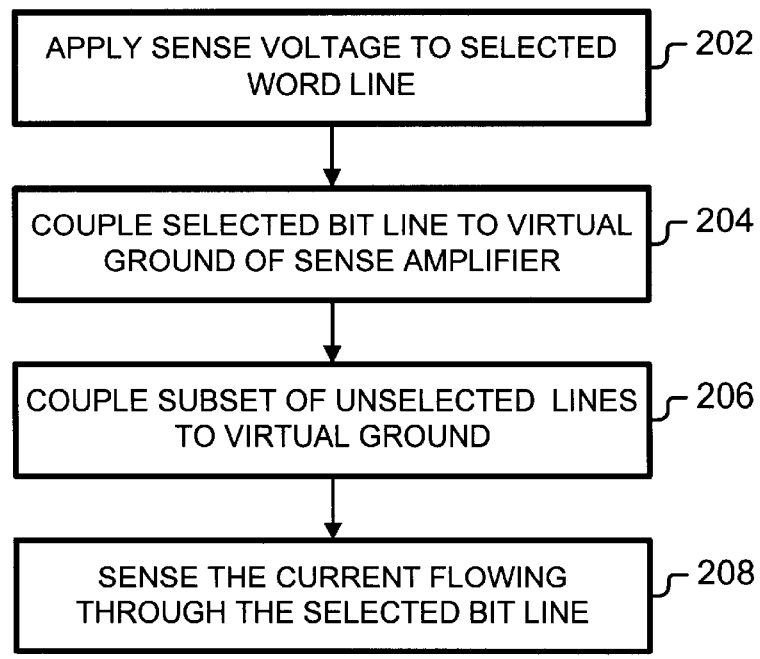
FIG. 6 is an illustration of a second method of reading a memory cell in an MRAM memory cell array.

Reference is now made to FIG. 6, which illustrates a method of using a current sense amplifier and a voltage source to detect the resistance state of a selected memory cell. The row decode circuit applies a sense voltage Vs to the selected word line (block 202), and the selected bit line is coupled to a virtual ground of the current sense amplifier (block 204). The sense voltage Vs may be a dc voltage between 0.1 volts and 0.5 volts and may be provided by an external source. A subset of unselected lines (e.g., all unselected bit lines) is also connected to the virtual ground (block 206). The virtual ground may be a zero potential or any other potential, so long as an equal potential is applied to the selected bit line and the subset of unselected lines.

A sense current flows from the voltage source, through the selected memory cell, and through the current sense amplifier. Because the subset of unselected lines is also connected to the virtual ground, any sneak path currents flowing through the unselected lines will follow their own separate paths and will not interfere with the sense current flowing through the selected bit line.

The sense current flowing through the selected bit line may be sensed to determine the resistance state and, therefore, logic value of the selected memory cell (block 208). The sense current is equal to either Vs/R or $Vs/(R+\Delta R)$, depending upon the resistance state of the selected memory cell.

FIG. 7 shows a hardware implementation of the method described in connection with FIG. 6. The row decode circuit 18 applies the sense voltage Vs to the selected word line 14 by connecting the selected word line 14 to a voltage source 251.

The sense amplifier 24 includes a current sense amplifier 252 for sensing the sense current. The current sense amplifier 252 may be an operational amplifier 254 having its non-inverting input connected to ground and its inverting input connected to the selected bit line 16. A resistor Rf is coupled between the inverting input and an output of the operational amplifier 254. Such an operational amplifier 254 is configured to have an output magnitude of either $V1=Vs \times Rf/R$ or $V2=Vs \times Rf/(R+\Delta R)$.

During a read operation, the steering circuit 22 connects the selected bit line to the current sense amplifier 252 and connects all unselected bit lines to the virtual ground. The selected bit line is connected to a virtual ground via the current sense amplifier 252. Thus, the same potential is applied to the selected bit line and the unselected bit lines.

A comparator 256 compares the amplifier output to a reference voltage Vref. The reference voltage Vref may be a voltage between V1 and V2. That is, $V1 \leq Vref \leq V2$. An output of the comparator 256, which indicates either a logic '0' or a logic '1', is stored in the data register 32.

The unselected bit lines are shown as being connected to the ground potential by the steering circuit 22. However, unselected word lines may instead be connected to the virtual ground.

Multiple sense amplifiers 252 may be connected to multiple selected bit lines that cross memory cells in the same selected row. Thus, multiple memory cells may be read in parallel.

Figure 8:
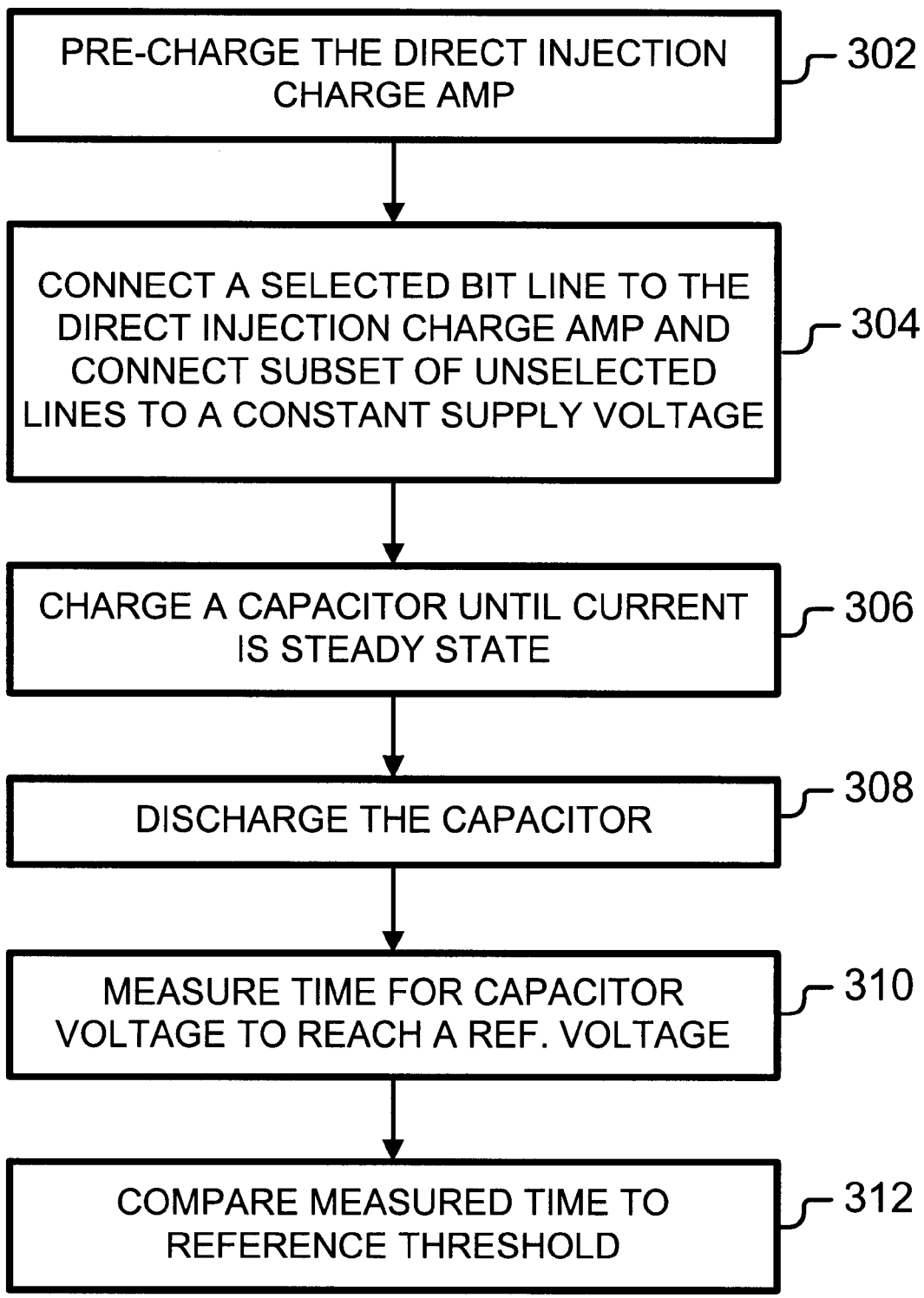
FIG. 8 is an illustration of a third method of reading a memory cell in an MRAM memory cell array.

Reference is now made to FIG. 8, which illustrates a method of using a direct injection charge amplifier to apply an equal potential to the array 10 during a read operation on a selected memory cell 12. At the beginning of a read operation, the direct injection charge amplifier is pre-charged to a voltage $V_{DD}$ (block 302), and then the selected bit line is connected to the direct injection charge amplifier and a subset of unselected lines is connected to a constant supply voltage Vs (block 304). Consequently, a sense current flows through the selected memory cell and charges a capacitor. After the sense current has reached a steady state condition (block 306), the capacitor is used to supply the sense current to the selected bit line (block 308). This causes a depletion of the charge stored in the capacitor and causes the capacitor voltage to decay. As the sense current is integrated, capacitor voltage is increased. The time for the capacitor voltage to reach a reference voltage is measured (block 310), and the measured time is compared to a threshold (block 312). The comparison indicates the resistance state and, therefore, logic value of the selected memory cell.

Figure 9:
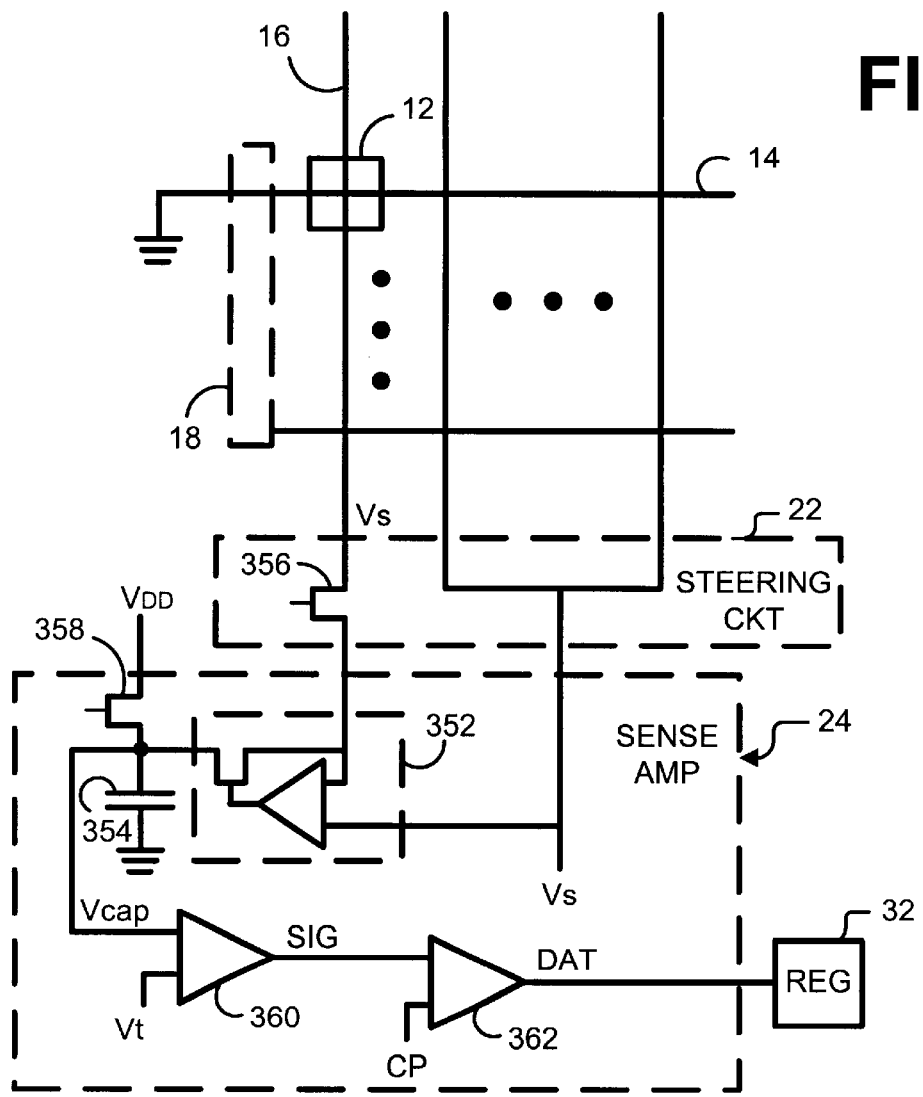
FIG. 9 is an illustration of a hardware implementation of the third method.

FIG. 9 shows a hardware implementation of the method described in connection with FIG. 8. The sense amplifier 24 includes the direct injection charge amplifier 352 and the capacitor 354. A steering circuit switch 356 coupling the charge amplifier 352 and capacitor 354 to the selected bit line will be referred to as the first switch 356. A second switch 358, which is part of the sense amplifier 24, couples the capacitor 354 to a source providing a voltage $V_{DD}$.

At the beginning of a read operation, the second switch 358 is closed, whereby the capacitor 354 begins to be charged. Once the capacitor 354 has been charged to the voltage $V_{DD}$, the second switch 358 is opened and the first switch 356 is closed, whereby the capacitor 354 supplies a sense current to the selected bit line 16. The sense current flows through the selected memory cell 12. The charge amplifier 352 applies a regulated sense voltage Vs to the selected bit line 16.

Figure 10:
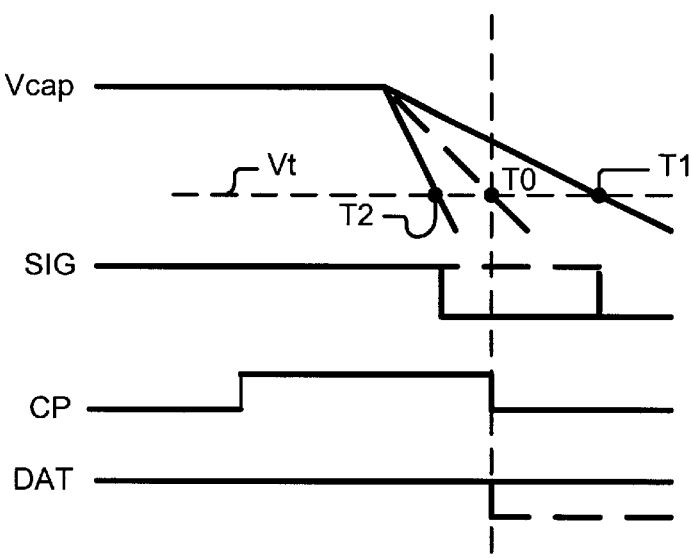
FIG. 10 is an illustration of signals generated during a read operation by the hardware implementation of FIG. 9.

Additional reference is now made to FIG. 10. The capacitor 354 becomes discharged as the sense current flows through the selected memory cell 12. Consequently, the voltage Vcap on the capacitor 354 falls. The rate at which the capacitor voltage Vcap falls is dependent upon the resistance of the selected memory cell 12. The capacitor voltage Vcap will fall slower if the selected memory cell 12 has the higher resistance (R+ΔR) and the capacitor voltage Vcap will fall faster if the selected memory cell 12 has a lower resistance (R).

A first comparator 360 compares the capacitor voltage Vcap to a threshold voltage Vt. The resistance state of the selected memory cell 12 can then be determined according to the time for reaching the threshold voltage Vt.

For example, a second comparator 362 may compare an output of the So first comparator 360 to a clock pulse CP, which transitions from high to low (or vice versa) at a specific time. An output of the second comparator 362 provides a data signal DAT to the data register 32. If the capacitor voltage Vcap drops below the threshold voltage Vt before the clock pulse CP transitions, the data signal DAT indicates a logic value (indicated by the solid line) corresponding to the low cell resistance (R). If the capacitor voltage Vcap drops below the threshold Vt after the clock transitions, the data signal DAT provides a logic value (indicated by the dashed line) corresponding to the high cell resistance (R+ΔR).

The threshold voltage Vt may be a dc voltage that is less than $V_{DD}$ but greater than Vs. That is, Vs<Vt<$V_{DD}$. The transition of the clock pulse CP may occur at a time T0 between the switching threshold time T1 of the high resistance state and the switching threshold time T2 of the low resistance state. Both the threshold voltage Vt and the clock pulse CP may be generated by an external reference circuit.

While the first switch 356 is closed, the steering circuit 22 applies the voltage Vs to the unselected bit lines. The voltage Vs applied to the unselected bit lines has the same magnitude as the voltage applied to the selected bit lines. Thus, sneak path currents do not interfere with the sense current. The voltage Vs may instead be applied to the unselected word lines.

The charge amplifier may be of the type disclosed in U.S. Ser. No. 09/430,238 filed Oct. 29, 1999 and incorporated herein by reference. Such a charge amplifier includes calibration circuits that correct for errors in the current steering circuit and other circuits forming a part of the input current path. This effect greatly relaxes the design tolerances of the circuit design with respect to the sizing of current steering devices and multiplexer switches.

The reference voltages Vref and other reference signals (e.g., Vt) in the hardware implementations above may be generated in any number of ways. For example, a reference voltage Vref may be established by a simple resistive network of dummy memory cells.

The type of signal generation scheme will depend in part upon the ability to control variations in memory cell resistances across the array. If the manufacturing process is well controlled, a single external reference signal generator may be used to generate global reference signals. If, however, the nominal resistance of the memory cells varies greatly across an array, a global reference voltage signal might not provide an accurate reference voltage for each memory cell in the array. Different methods of generating reference signals are disclosed in assignee's U.S. Ser. No. 09/598,671 filed Jun. 20, 2000.

Figure 11:
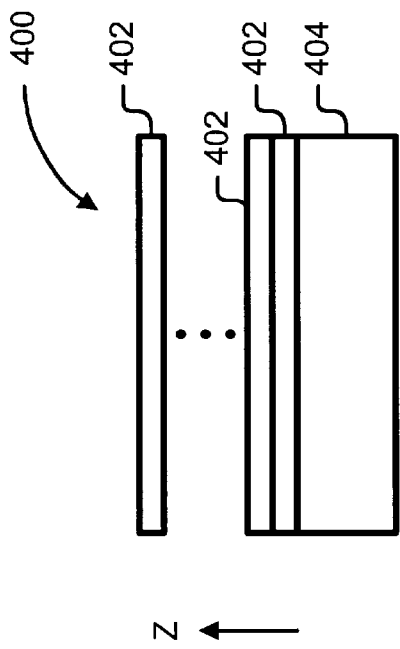
FIG. 11 is an illustration of an MRAM chip including multiple levels.

Reference is now made to FIG. 11, which illustrates a multi-level MRAM chip 400. The MRAM chip 400 includes a number Z of memory cell levels or planes 402 that are stacked in a z-direction on a substrate 404. The number Z is a positive integer where Z>1. The memory cell levels 402 may be separated by insulating material (not shown) such as silicon dioxide. Read and write circuits may be fabricated on the substrate 404. The read and write circuits may include additional multiplexers for selecting the levels that are read from and written to.

Thus disclosed is an MRAM device in which resistance states of memory cells can be sensed reliably during read operations. Parasitic currents are blocked or re-directed so as not obscure sense currents during read operations. Moreover, the parasitic currents are blocked or re-directed without modifying the memory cell structure.

Figure 12:
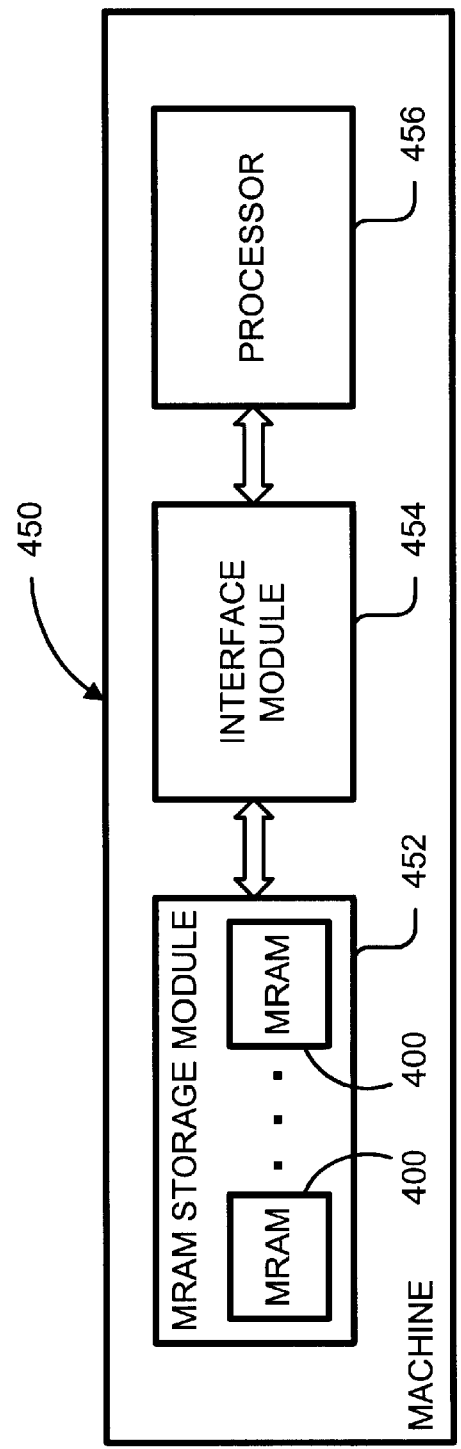
FIG. 12 is an illustration of a machine including one or more MRAM chips.

The MRAM device according to the present invention may be used in a variety of applications. FIG. 12 shows an exemplary general application for one or more MRAM chips 400. The general application is embodied by a machine 450 including an MRAM storage module 452, an interface module 454 and a processor 456. The MRAM storage module 452 includes one or more MRAM chips 400 for long term storage. The interface module 454 provides an interface between the processor 456 and the MRAM storage module 452. The machine 450 could also include fast volatile memory (e.g., SRAM) for short term storage.

For a machine 450 such as a notebook computer or personal computer, the MRAM storage module 452 might include a number of MRAM chips 400 and the interface module 454 might include an EIDE or SCSI interface. For a machine 450 such as a server, the MRAM storage module 452 might include a greater number of MRAM chips 400, and the interface module 454 might include a fiber channel or SCSI interface. Such MRAM storage modules 452 could replace or supplement conventional long term storage devices such as hard drives.

For a machine 450 such as a digital camera, the MRAM storage module 452 might include a smaller number of MRAM chips 400 and the interface module 454 might include a camera interface. Such an MRAM storage module 452 would allow long-term storage of digital images on-board the digital camera.

The MRAM device according to the present invention offers many advantages over hard drives and other conventional long-term data storage devices. Accessing data from the MRAM devices is orders of magnitude faster than accessing data from conventional long-term storage devices such as hard drives. Additionally, MRAM devices are more compact than hard drives.

The memory device is not limited to the specific embodiments described and illustrated above. For instance, an MRAM device is not limited to the use of spin dependent tunneling devices. Other types of devices that could be used include, but are not limited to, giant magnetoresistance ("GMR") devices.

The MRAM device has been described in connection with the rows being oriented along the easy axis. However, the rows and columns could be transposed.

The memory device is not limited to MRAM cells. The memory device may include any type of memory cell in a resistive cross point array.

The equal potential may be applied to unselected bit lines. However, the equal potential may be applied to unselected word lines instead of unselected bit lines.

The unselected lines may be a subset of word lines or bit lines. The subset to which the equal potential is applied is not limited to all of the word lines or all of the bit lines. For example, the equal potential may be applied to a subset of bit lines in the neighborhood of the selected bit line. The subset may be a combination of bit lines and word lines.

The present invention is not limited to the specific embodiments described and illustrated above. Instead, the invention is construed according to the claims that follow.

What is claimed is:

1. A method of performing a read operation on a selected memory cell in a resistive cross point array of memory cells, a plurality of word lines crossing rows of the memory cells, a plurality of bit lines crossing columns of the memory cells, the method comprising the steps of:

applying a first potential to a selected bit line crossing the selected memory cell and a second potential to a selected word line crossing the selected memory cell;

applying a third potential to a subset of unselected word and bit lines, the third potential being equal to the first potential; and determining the resistance state of the selected memory cell while the potentials are being applied to the selected lines and subset of unselected lines.

2. The method of claim 1, wherein a current source is used to supply a current to the selected bit line and a voltage follower is used to detect the first potential and apply the third potential to the subset of unselected lines.

3. The method of claim 2, wherein the current source is a charge pump that provides a constant current to the selected bit line; and wherein the resistance state of the selected memory cell is determined by comparing a threshold to a potential at a junction between the current source and the selected memory cell, the comparison indicating whether the selected memory cell has a high or low resistance state.

4. The method of claim 1, wherein a current sense amplifier is connected between the selected bit line and a virtual ground; and wherein the third potential is applied to the subset of unselected lines by connecting said subset to the virtual ground.

5. The method of claim 4, wherein the sense amplifier includes an active amplifier; and wherein the resistance state is determined by using the active amplifier to amplify a signal on the selected bit line, and comparing the amplified signal to a reference voltage, the comparison indicating whether the selected memory cell has a high or low resistance state.

6. The method of claim 1, wherein a decaying first potential is applied to the selected bit line; and wherein a decay time is observed to determine the resistive state of the selected memory cell.

7. The method of claim 6, further comprising the step of using a charge amplifier to regulate the voltage on the selected bit line while the decaying first potential being is applied to the selected bit line.

8. The method of claim 6, wherein the resistance is determined by integrating a current flowing through the selected memory cell, and determining whether the memory cell has a high or low resistance according to integration time of the current.

9. The method of claim 8, further comprising the step of allowing a steady state current to flow through the selected memory cell before the current integration is performed.

10. The method of claim 1, wherein the third potential is applied to the unselected bit lines in the neighborhood of the selected bit line.

11. Apparatus for reading a selected memory cell in a resistive cross point array of memory cells, a plurality of word lines crossing rows of the memory cells, a plurality of bit lines crossing columns of the memory cells, the apparatus comprising:

means for applying a first potential to a selected bit line crossing the selected memory cell and a second potential to a selected word line crossing the selected memory cell;

means for applying a third potential to a subset of unselected word and bit lines, the third potential being equal to the first potential; and means for determining the resistance state of the selected memory cell while the potentials are being applied to the selected lines and the subset of unselected lines.

12. A data storage device comprising:

a resistive cross point array of memory cells;

a plurality of word lines extending along rows of the array;

a plurality of bit lines extending along columns of the array; and a circuit for sensing resistance states of selected memory cells during read operations on the selected memory cells, the circuit applying a first potential to selected bit lines, a second potential to selected word lines and a third potential to subsets of unselected word and bit lines, the third potential being equal to the first potential.

13. The device of claim 12, wherein the circuit includes a current source, steering switches for coupling the current source to selected bit lines during read operations, and a voltage follower for detecting the first potential and applying the third potential to the subset of unselected lines during read operations.

14. The device of claim 13, wherein the current source includes a charge pump; and wherein the circuit further includes a comparator for comparing a reference voltage to a potential at a junction between the current source and the selected bit line during a read operation.

15. The device of claim 12, wherein the circuit applies a sense voltage source to the selected word line during a read operation; and wherein the circuit includes a current sense amplifier and steering switches for connecting the current sense amplifier between the selected bit line and a virtual ground during a read operation, whereby the first potential is applied to the selected bit line; and wherein the steering switches connect the subset of unselected lines to the virtual ground during the read operation.

16. The device of claim 15, wherein the sense amplifier includes an active amplifier; and wherein the circuit further includes a comparator for comparing an output of the active amplifier to a reference voltage, an output of the comparator indicating whether the selected memory cell has a high or low resistance state.

17. The device of claim 12, wherein the circuit includes a capacitor for providing a decaying first potential to the selected bit line during read operations.

18. The device of claim 17, wherein the circuit further includes a charge amplifier for regulating the first potential on the selected bit line while the capacitor is applying the first potential to the selected bit line.

19. The device of claim 17, wherein the circuit further includes a sense amplifier for integrating a current flowing through the selected memory cell and determining whether the selected memory cell has a high or low resistance according to decay time of capacitor voltage.

20. The device of claim 19, wherein the memory cells are MRAM cells.

21. Apparatus for reading a selected memory cell in a resistive cross point array of memory cells, the selected memory cell being at a cross point of first and second selected traces, the apparatus comprising:

means for applying a first potential to the first trace and a second potential to the second trace;

means for applying a third potential to a subset of traces not crossing the selected memory cell, the third potential being equal to the first potential; and means for determining the resistance state of the selected memory cell while the potentials are being applied to the selected traces and the subset of unselected traces.

22. A data storage device comprising:

a resistive cross point array of memory cells;

a plurality of first traces lines extending along the array in a first direction;

a plurality of second traces extending along the array in a second direction, each memory cell being at a cross point of one of the first traces and one of the second traces; and a circuit for sensing resistance states of selected memory cells during read operations on the selected memory cells, the circuit applying a first potential to the first traces crossing the selected memory cells, a second potential to the second traces crossing the selected memory cells, and a third potential to subsets of traces not crossing the selected memory cells, the third potential being equal to the first potential.

23. The device of claim 22, wherein the circuit includes a current source and a voltage follower for detecting the first potential and applying the third potential to the subset of unselected traces during read operations.

24. The device of claim 23, wherein the current source includes a charge pump; and wherein the circuit further includes a comparator for comparing a reference voltage to a potential at a junction between the current source and a selected trace during a read operation.

25. The device of claim 22, wherein the circuit includes a current sense amplifier connected to a virtual ground during a read operation; and wherein the circuit applies a sense voltage source to one of the selected first and second traces during a read operation and connects the subset of unselected traces to the virtual ground during the read operation.

26. The device of claim 25, wherein the sense amplifier includes an active amplifier; and wherein the circuit further includes a comparator for comparing an output of the active amplifier to a reference voltage, an output of the comparator indicating whether the selected memory cell has a high or low resistance state.

27. The device of claim 22, wherein the circuit includes a capacitor for providing a decaying first potential to selected traces during read operations.

28. The device of claim 27, wherein the circuit further includes a charge amplifier for regulating the first potential on the selected traces while the capacitor is applying the first potential to the selected traces.

29. The device of claim 27, wherein the circuit further includes a sense amplifier for integrating a current flowing through the selected memory cells and determining whether the selected memory cells have a high or low resistance according to decay time of capacitor voltage.

30. The device of claim 22, wherein the memory cells are magnetic memory cells.

* * * * *